(12) United States Patent
Ichinose et al.

(10) Patent No.: US 11,525,872 B2
(45) Date of Patent: Dec. 13, 2022

(54) VEHICLE MAGNETIC FIELD DETECTOR AND VEHICLE MAGNETIC FIELD MEASUREMENT SYSTEM

(71) Applicant: Toyota Jidosha Kabushiki Kaisha, Toyota (JP)

(72) Inventors: Kenichi Ichinose, Toyota (JP); Soichiro Ota, Toyota (JP); Toshio Watari, Nagoya (JP); Keishi Miwa, Toyota (JP); Mikiko Suzuki, Toyota (JP); Takeshi Kawano, Chita (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 17/397,555

(22) Filed: Aug. 9, 2021

(65) Prior Publication Data

US 2022/0050148 A1 Feb. 17, 2022

(30) Foreign Application Priority Data

Aug. 11, 2020 (JP) .............................. JP2020-135904

(51) Int. Cl.
*G01R 33/06* (2006.01)
*G01R 33/02* (2006.01)

(52) U.S. Cl.
CPC ....... *G01R 33/063* (2013.01); *G01R 33/0206* (2013.01)

(58) Field of Classification Search
CPC ............. G01R 33/00; G01R 33/0035; G01R 33/0023; G01R 33/0017; G01R 31/3191; G01R 33/063; G01R 33/0206; G01B 7/004; G01C 17/38; G06F 3/017; G06F 3/0346; G06F 3/012
See application file for complete search history.

(56) References Cited

U.S. PATENT DOCUMENTS

2005/0242805 A1* 11/2005 Honkura ............ G01R 33/0206
324/249
2007/0084070 A1* 4/2007 Honkura ................. G01C 17/38
33/356

(Continued)

FOREIGN PATENT DOCUMENTS

| JP | H08-184656 A | 7/1996 |
| JP | 2007-017425 A | 1/2007 |
| JP | 5054926 B2 | 10/2012 |

*Primary Examiner* — Jermele M Hollington
*Assistant Examiner* — Taqi R Nasir
(74) *Attorney, Agent, or Firm* — Dinsmore & Shohl LLP

(57) ABSTRACT

The magnetic field detector includes an x-axis magnetic sensor, a y-axis magnetic sensor, and a z-axis magnetic sensor for detecting magnetic field components in three orthogonal axis directions. Each of the magnetic sensors includes a magnetic impedance element having an impedance that varies in accordance with an ambient magnetic field and an output circuit configured to output a magnetic field detection value that varies in accordance with the impedance of the magnetic impedance element. The magnetic field detector includes an oscillator configured to supply a common drive signal to the magnetic impedance element of each of the magnetic sensors, wherein each of the magnetic sensors outputs, in response to the drive signal, the magnetic field detection value from the output circuit.

5 Claims, 4 Drawing Sheets

(56) References Cited

U.S. PATENT DOCUMENTS

2012/0313193 A1* 12/2012 Rieger ................. G01R 33/028
                                                    257/E29.323
2017/0326995 A1* 11/2017 Kotani ..................... B60P 1/48
2017/0336503 A1* 11/2017 Hammerschmidt ...... H01P 3/12

* cited by examiner

VEHICLE MAGNETIC FIELD DETECTOR AND VEHICLE MAGNETIC FIELD MEASUREMENT SYSTEM

CROSS REFERENCE TO RELATED APPLICATION

This application claims priority to Japanese Patent Application No. 2020-135904 filed on Aug. 11, 2020, which is incorporated herein by reference in its entirety including the specification, claims, drawings, and abstract.

TECHNICAL FIELD

The present disclosure relates to a vehicle magnetic field detector and a vehicle magnetic field measurement system and, in particular, to techniques for detecting magnetic fields emitted from on-vehicle components.

BACKGROUND

Electrically powered vehicles such as hybrid electric vehicles and battery electric vehicles are widely used. An electrically powered vehicle has installed thereon, for example, a motor generator for traveling and an electric circuit for controlling the motor generator. In recent years, research is being performed on, for example, the influence of magnetic fields on the human body in the vehicle cabin, and there are standards that define the maximum magnetic fields (the upper limit to the amount of exposure to magnetic fields) emitted from, for example, motor generators and electric circuits that are installed in vehicles. Examples of such standards include "Controlling Limits for Electromagnetic Environment" (standard ID GB8702-2014) and "Measurement Methods for Electromagnetic Fields of Vehicle with Regard to Human Exposure" (standard ID GB/T 37130-2018).

JP 2007-17425 A discloses a magnetic field measurement device for measuring the amount of exposure to magnetic fields emanating from electric components. This magnetic field measurement device includes a loop coil that serves as a magnetic sensor for detecting magnetic fields.

SUMMARY

One of the above-described standards (GB/T 37130-2018) defines the upper limit to magnetic field intensities in a low-frequency band of not less than 10 Hz and not greater than 400 kHz. Typically, when a loop coil is used as a magnetic sensor, the lower the frequency of a magnetic field, the lower the detection value, and the larger the loop coil, the higher the detection value. As such, to obtain a sufficient level of detection value in response to a low-frequency band magnetic field, the loop coil should be upsized. Therefore, when a loop coil is used as a magnetic sensor, it is sometimes difficult to narrow intervals between magnetic field detection positions.

The present disclosure is directed toward downsizing of a magnetic sensor in a magnetic field detector.

According to an aspect of the present disclosure, there is provided a vehicle magnetic field detector for detecting magnetic field emission from an on-vehicle component. The vehicle magnetic field detector comprises a plurality of magnetic sensors configured to detect magnetic fields of different directions. Each of the plurality of magnetic sensors comprises a magnetic impedance element having an impedance that varies in accordance with an ambient magnetic field; and an output circuit configured to output a magnetic field detection value that varies in accordance with the impedance of the magnetic impedance element.

In one embodiment, the vehicle magnetic field detector comprises an oscillator configured to supply a common drive signal to the magnetic impedance element of each of the plurality of magnetic sensors. In response to the drive signal, each of the plurality of magnetic sensors outputs the magnetic field detection value from the output circuit.

In one embodiment, the vehicle magnetic field detector comprises an interface circuit configured to match an input impedance of a signal measurement device that is connected to the vehicle magnetic field detector and an output impedance of the output circuit to each other.

In one embodiment, the vehicle magnetic field detector comprises three magnetic sensors. The three magnetic sensors are configured to detect magnetic field components in three orthogonal axis directions.

According to another aspect, there is provided a vehicle magnetic field measurement system comprising the vehicle magnetic field detector; a scanning device configured to scan the vicinity of the on-vehicle component using the vehicle magnetic field detector; and a computer configured to determine a magnetic field emission intensity based on a plurality of magnetic field detection values obtained from the plurality of magnetic sensors for each of positions in the vicinity of the on-vehicle component at which the plurality of magnetic sensors detect magnetic fields.

The present disclosure enables downsizing of a magnetic sensor in a magnetic field detector.

BRIEF DESCRIPTION OF DRAWINGS

Embodiments of the present disclosure will be described based on the following figures, wherein.

DESCRIPTION OF EMBODIMENTS

Figure 1:
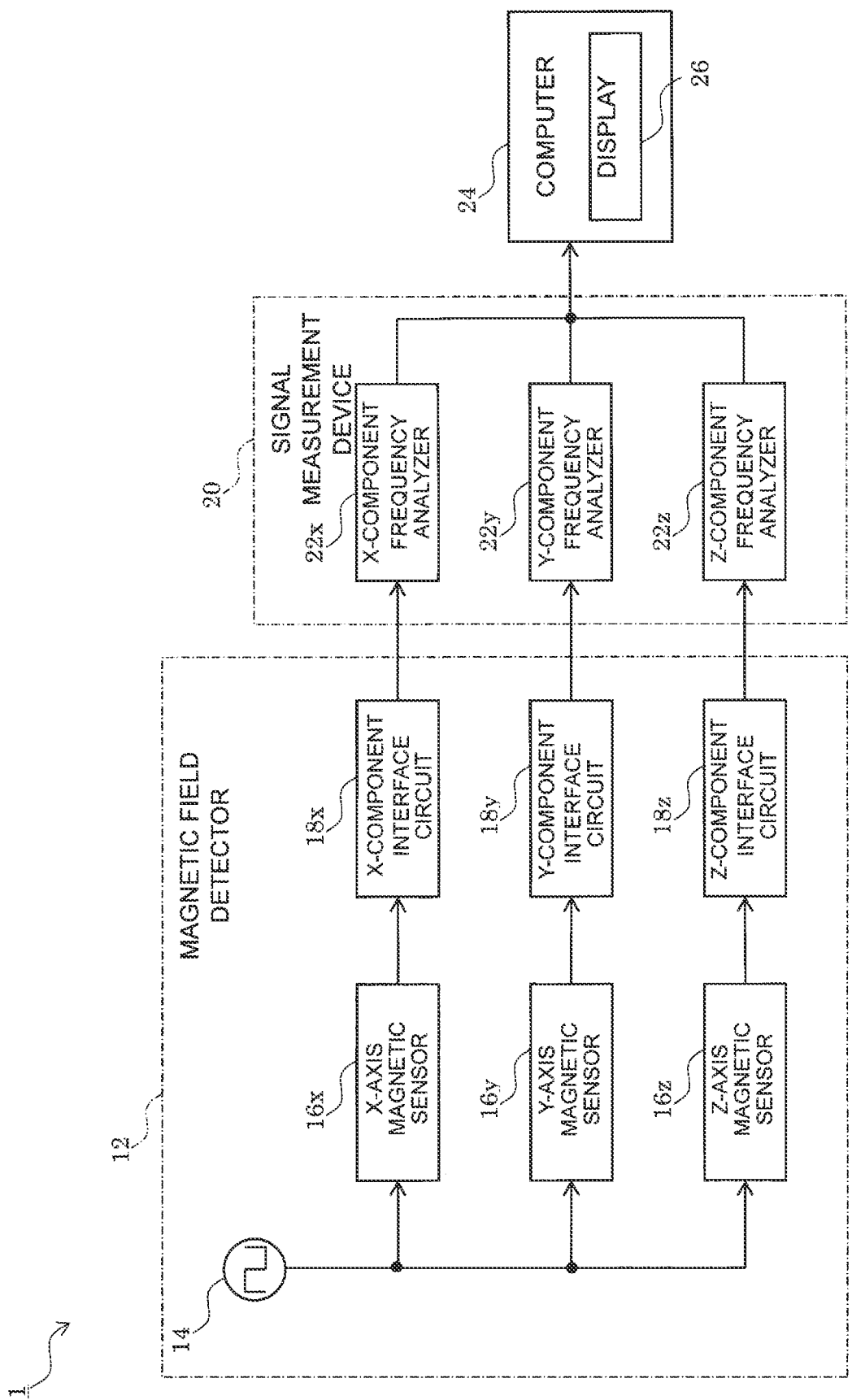
FIG. 1 illustrates a structure of a vehicle magnetic field measurement device according to a first embodiment.

Embodiments of the present disclosure will be described below with reference to the accompanying drawings. The same elements in two or more drawings are denoted by the same reference numerals, and their repeated description will be simplified.

FIG. 1 illustrates a structure of a vehicle magnetic field measurement device 1 according to a first embodiment of the present disclosure. The vehicle magnetic field measurement device 1 measures a magnetic field intensity by measuring magnetic field components in x-axis, y-axis, and z-axis directions that are orthogonal to each other, and combining measurement values of the magnetic field components that are measured in the respective directions. Targets that are to be measured by the vehicle magnetic field measurement device 1 are magnetic fields that are emitted from on-vehicle components (hereinafter referred to as magnetic field emission). Examples of such on-vehicle components include inverters, DC/DC converters, and other electric circuits, motor generators, batteries, and power cables.

The vehicle magnetic field measurement device 1 includes a magnetic field detector 12, a signal measurement device 20, and a computer 24. The magnetic field detector 12 is disposed close to one or more on-vehicle components. The magnetic field detector 12 includes an x-axis magnetic sensor 16x, a y-axis magnetic sensor 16y, and a z-axis magnetic sensor 16z (hereinafter sometimes referred to as magnetic sensors 16x, 16y, and 16z) that detect magnetic field components in the x-axis direction, in the y-axis direction, and in the z-axis direction, respectively. The magnetic field detector 12 further includes an oscillator 14. The oscillator 14 outputs drive signals to the magnetic sensors 16x, 16y, and 16z for operating the magnetic sensors 16x, 16y, and 16z.

The magnetic field detector 12 further includes an x-component interface circuit 18x, a y-component interface circuit 18y, and a z-component interface circuit 18z (hereinafter sometimes referred to as interface circuits 18x, 18y, and 18z). The interface circuits 18x, 18y, and 18z match output impedances of the magnetic sensors 16x, 16y, and 16z and an input impedance of the signal measurement device 20 that is connected to the magnetic field detector 12 to each other.

The signal measurement device 20 includes an x-component frequency analyzer 22x, a y-component frequency analyzer 22y, and a z-component frequency analyzer 22z (hereinafter sometimes referred to as frequency analyzers 22x, 22y, and 22z). The frequency analyzers 22x, 22y, and 22z perform Fourier transform processing on magnetic field detection signals that are output from the magnetic sensors 16x, 16y, and 16z via the interface circuits 18x, 18y, and 18z to determine measurement values of the magnetic field components in the x-axis direction, in the y-axis direction, and in the z-axis direction for frequencies in a frequency band defined by standards.

The computer 24 combines, for each of the frequencies, the measurement values that are output from the x-component frequency analyzer 22x, the y-component frequency analyzer 22y, and the z-component frequency analyzer 22z to determine the intensity of magnetic field emission from one or more on-vehicle components for each of the frequencies.

Figure 2:
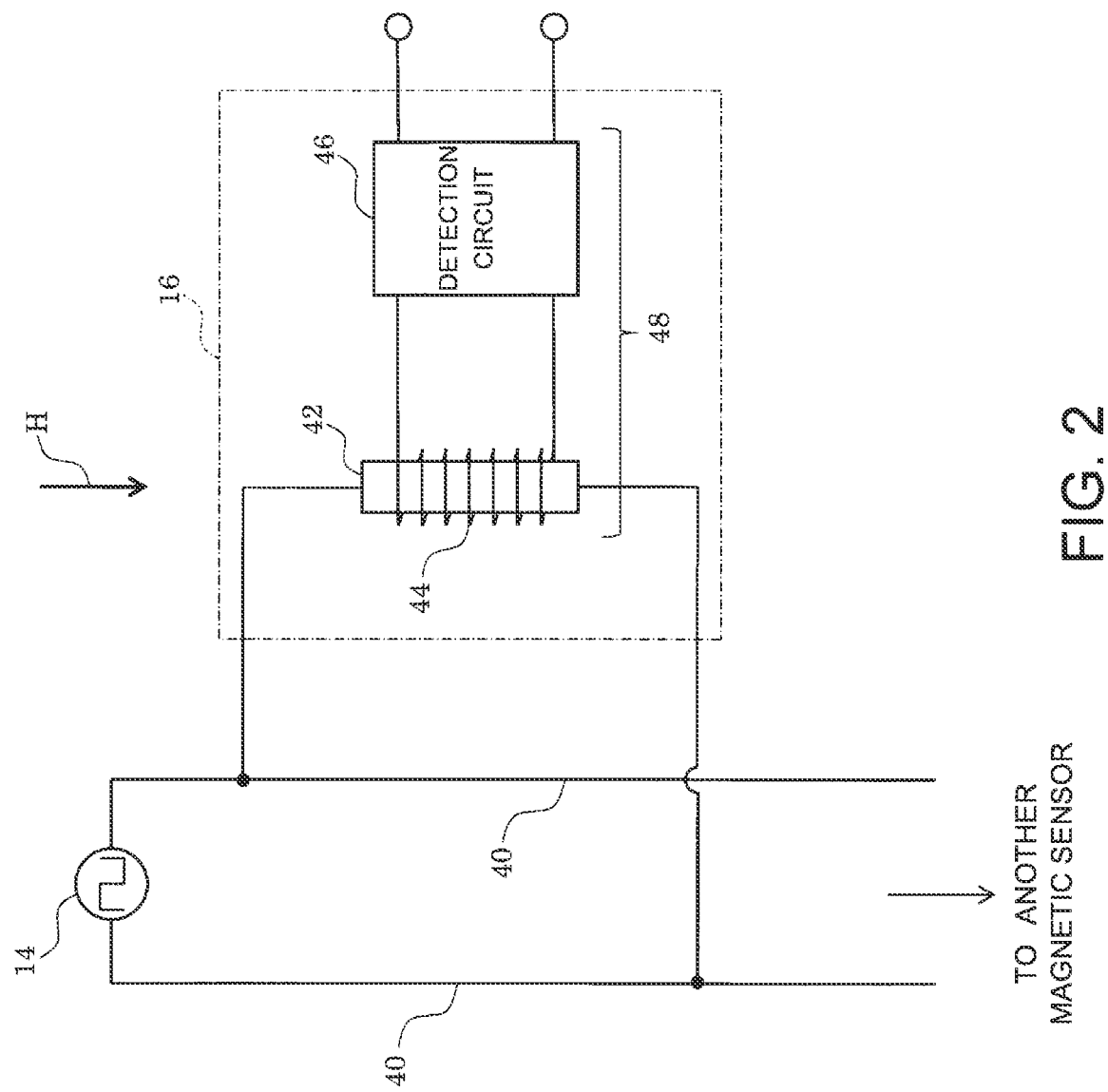
FIG. 2 illustrates a structure of a magnetic sensor.

The vehicle magnetic field measurement device 1 will be described in detail below. FIG. 2 illustrates a structure of a magnetic sensor 16. The magnetic sensor 16 may serve as the x-axis magnetic sensor 16x, the y-axis magnetic sensor 16y, and the z-axis magnetic sensor 16z. The magnetic sensor 16 includes a magnetic impedance element 42, an output coil 44, and a detection circuit 46. In response to a high-frequency current or a pulse current that generates the skin effect, the magnetic impedance element 42 causes the impedance to vary in accordance with the change in ambient magnetic field H in a certain direction. In the illustrated embodiment, an element that is composed of linear magnetic material such as amorphous alloy wire is used as the magnetic impedance element 42. Such a magnetic impedance element has an impedance that varies in accordance with the ambient magnetic field H in the longitudinal direction.

When the magnetic sensor 16 is used as the x-axis magnetic sensor 16x, the magnetic sensor 16 is disposed in a posture in which the longitudinal direction of the magnetic impedance element 42 corresponds to the x-axis direction. Similarly, when the magnetic sensor 16 is used as the y-axis magnetic sensor 16y or the z-axis magnetic sensor 16z, the magnetic sensor 16 is disposed in a posture in which the longitudinal direction of the magnetic impedance element 42 corresponds to the y-axis direction or the z-axis direction.

A conductor wound around the magnetic impedance element 42 forms the output coil 44. Both ends of the output coil 44 are connected to the detection circuit 46. The output coil 44 and the detection circuit 46 constitute an output circuit 48 that outputs a magnetic field detection value that varies in accordance with the ambient magnetic field H.

Both ends of the magnetic impedance element 42 are connected to a pair of signal supply lines 40 that extend from the oscillator 14. The oscillator 14 applies a pulse voltage including periodic pulse waves to the magnetic impedance element 42 as a drive signal. The impedance of the magnetic impedance element 42 varies in accordance with the change in ambient magnetic field H. As such, a current that varies in accordance with the ambient magnetic field H flows in the magnetic impedance element 42, and an induced electromotive force having a magnitude that varies in accordance with the ambient magnetic field H is generated in the output coil 44. As a result, a detection signal including an amplitude modulation component based on the ambient magnetic field H is output from the output coil 44 to the detection circuit 46. The detection circuit 46 extracts the amplitude modulation component from the detection signal and outputs from the magnetic sensor 16 a magnetic field detection signal (magnetic field detection value) representing the amplitude modulation component.

Returning to FIG. 1, description of the vehicle magnetic field measurement device 1 will be continued below. The x-component interface circuit 18x matches the output impedance of the output circuit 48 of the x-axis magnetic sensor 16x and the input impedance of the x-component frequency analyzer 22x to each other. For example, the x-component interface circuit 18x causes the impedance as viewed from the x-component frequency analyzer 22x toward the x-component interface circuit 18x to approximate or correspond to a complex conjugate of the input impedance of the x-component frequency analyzer 22x. Similarly, the interface circuits 18y and 18z respectively match the output impedances of the output circuits 48 of the magnetic sensors 16y and 16z and the input impedances of the frequency analyzers 22y and 22z to each other. As a result, magnetic field detection signals having sufficient levels are transmitted from the magnetic sensors 16x, 16y, and 16z to the frequency analyzers 22x, 22y, and 22z. Each of the interface circuits 18x, 18y, and 18z may include a filter circuit that reduces or eliminates direct current components or unwanted frequency components. Each of the interface circuits 18x, 18y, and 18z may include an amplifier circuit that amplifies magnetic field detection signals.

The x-component frequency analyzer 22x, the y-component frequency analyzer 22y, and the z-component frequency analyzer 22z may be spectrum analyzers. The x-axis magnetic sensor 16x outputs a magnetic field detection signal to the x-component frequency analyzer 22x via the x-component interface circuit 18x. The x-component frequency analyzer 22x performs Fourier transform processing on the magnetic field detection signal to determine measurement values of an x-axis direction magnetic field component for frequencies in a frequency band defined by standards (hereinafter referred to as standard band), and outputs them to the computer 24. Through similar operations, the y-component frequency analyzer 22y and the z-component frequency analyzer 22z determine measurement values of a y-axis direction magnetic field component and a z-axis direction magnetic field component for frequencies in the standard band, and output them to the computer 24.

The computer 24 combines, for each of the frequencies in the standard band, a measurement value of the x-axis direction magnetic field component, a measurement value of the y-axis direction magnetic field component, and a measurement value of the z-axis direction magnetic field component. More specifically, the computer 24 obtains a total sum by adding up the square of the measurement value of the x-axis direction magnetic field component, the square of the measurement value of the y-axis direction magnetic field component, and the square of the measurement value of the z-axis direction magnetic field component, and determines a magnetic field intensity based on the square root of the total sum. The computer 24 may display, on its display 26, the magnetic field intensity for each of the frequencies in the standard band. For example, the computer 24 may display, on the display 26, a frequency spectrum of magnetic field emission wherein the horizontal axis represents frequency, and the vertical axis represents intensity of magnetic field emission. By looking at the display 26, the user may judge whether or not the magnetic field emission intensity satisfies standards on magnetic field exposures.

The computer 24 may store measurement values of the x-axis direction, y-axis direction, and z-axis direction magnetic field components determined for frequencies in the standard band, and may display these measurement values on the display 26. Displaying the measurement values of the respective axis direction magnetic field components on the display 26 allows the user to easily identify the direction of magnetic field emission.

A magnetic sensor that includes the magnetic impedance element 42 may produce frequency deviations in magnetic field detection signal values, as detection values corresponding to magnetic fields having the same intensity differ depending on the frequencies of the magnetic fields. In this case, the computer 24 may perform frequency compensation processing, which will be described below. The computer 24 pre-stores calibration information for use in the frequency compensation processing. The calibration information includes calibration factors that are associated with measurement values of the x-axis direction, y-axis direction, and z-axis direction magnetic field components for each of the frequencies in the standard band. The frequency deviations are compensated for by multiplying measurement values of the x-axis direction, y-axis direction, and z-axis direction magnetic field components by the calibration factors. The calibration factors may be determined through experiment or simulation.

The computer 24 refers to the calibration information to obtain a calibration factor that is associated with the x-axis direction magnetic field component for each of the frequencies in the standard band, and multiplies a measurement value that is output from the x-component frequency analyzer 22x by the calibration factor. As a result, the computer 24 determines a measurement value of the x-axis direction magnetic field component for which the frequency deviation is compensated. Through similar processing, the computer 24 determines a measurement value of the y-axis direction magnetic field component and a measurement value of the z-axis direction magnetic field component for which the frequency deviations are compensated.

In the vehicle magnetic field measurement device 1 according to the illustrated embodiment, the magnetic impedance element 42 is used in the magnetic field detector 12. To obtain measurement values having the same level in response to magnetic fields having the same frequency, the magnetic impedance element 42 can be smaller in size than a sensor coil such as a loop coil. Therefore, the magnetic field detector 12 according to the illustrated embodiment enables narrower intervals between magnetic field emission measurement positions than when a sensor coil is used. Further, the magnetic field detector 12 that is smaller in size makes it easy to measure magnetic field emission in a confined space.

In the magnetic field detector 12 according to the illustrated embodiment, a common drive signal is supplied to the x-axis magnetic sensor 16x, the y-axis magnetic sensor 16y, and the z-axis magnetic sensor 16z. If it is assumed that the magnetic sensors 16x, 16y, and 16z have individual oscillators that operate out of synchronization with each other, the following problem may arise. Magnetic field detection signals that are output from the magnetic sensors 16x, 16y, and 16z may contain beat frequency components which are error components. The beat frequency is based on the difference in frequency between drive signals that are supplied to the magnetic sensors 16x, 16y, and 16z. Beat frequency components are generated by mutual interference of noise electromagnetic waves emitted from the magnetic sensors 16x, 16y, and 16z. In the illustrated embodiment, because a common drive signal is supplied to the magnetic sensors 16x, 16y, and 16z, beat frequency components in magnetic field detection signals that are output from the magnetic sensors 16x, 16y, and 16z are reduced.

Figure 3:
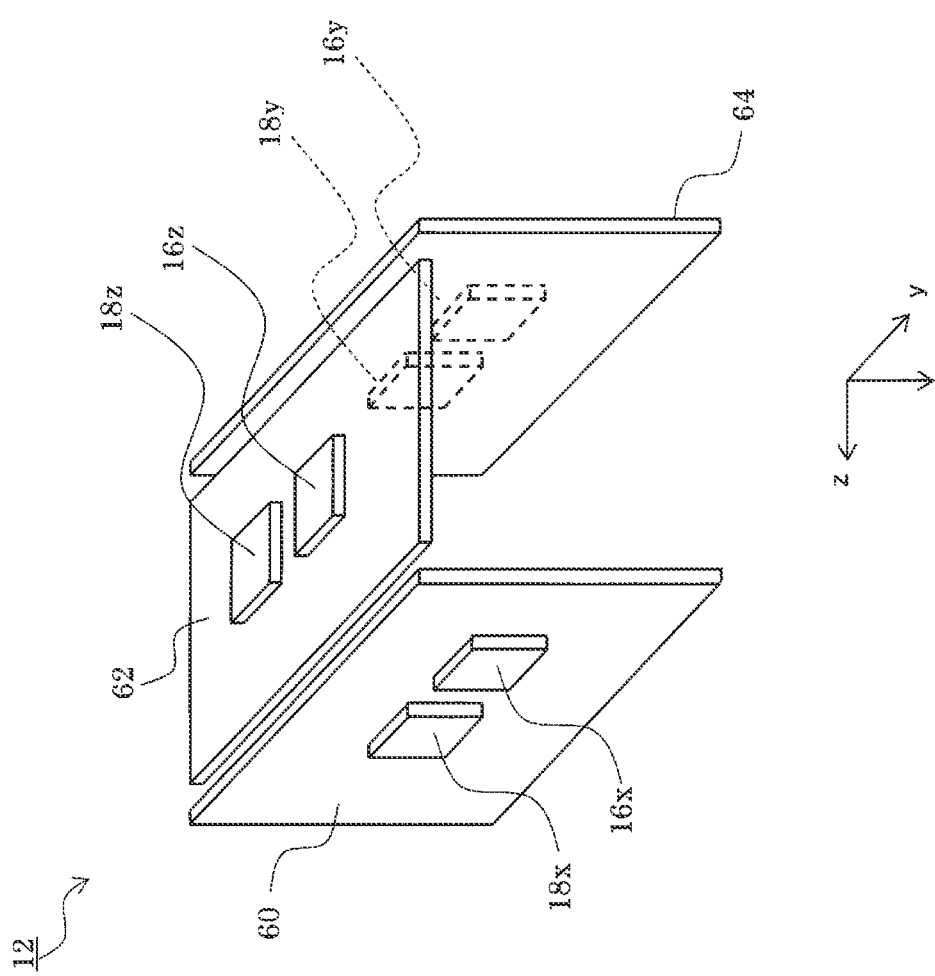
FIG. 3 illustrates an example of how to install a magnetic field detector.

FIG. 3 schematically illustrates an example of how to install the magnetic field detector 12. The magnetic field detector 12 has a structure including a first xy substrate 60, a yz substrate 62, and a second xy substrate 64, which are rectangular in shape, and to which electronic components that constitute the magnetic field detector 12 are fixed. The yz substrate 62 is disposed in a posture in which the shorter-side direction corresponds to the z-axis direction, and the longer-side direction corresponds to the y-axis direction. Each of the first xy substrate 60 and the second xy substrate 64 is disposed in a posture in which the shorter-side direction corresponds to the x-axis direction, and the longer-side direction corresponds to the y-axis direction. The first xy substrate 60 and the second xy substrate 64 oppose each other with their upper sides having the yz substrate 62 interposed therebetween.

The x-axis magnetic sensor 16x and the x-component interface circuit 18x are fixed to the first xy substrate 60. The y-axis magnetic sensor 16y and the y-component interface circuit 18y are fixed to the second xy substrate 64, and the z-axis magnetic sensor 16z and the z-component interface circuit 18z are fixed to the yz substrate 62. The magnetic sensors 16x, 16y, and 16z are fixed to the substrates in postures in which the longitudinal directions of the magnetic impedance elements respectively correspond to the x-axis direction, the y-axis direction, and the z-axis direction.

In addition to the x-axis magnetic sensor 16x and the x-component interface circuit 18x, the y-axis magnetic sensor 16y and the y-component interface circuit 18y may be fixed to the first xy substrate 60. In this case, the second xy substrate 64 may be eliminated. Similarly, in addition to the y-axis magnetic sensor 16y and the y-component interface circuit 18y, the x-axis magnetic sensor 16x and the x-component interface circuit 18x may be fixed to the second xy substrate 64. In this case, the first xy substrate 60 may be eliminated. In addition to the z-axis magnetic sensor 16z and the z-component interface circuit 18z, the y-axis magnetic sensor 16y and the y-component interface circuit 18y may be fixed to the yz substrate 62. In this case, the second xy substrate 64 may be eliminated.

In the above-described embodiment, the frequency analyzers 22x, 22y, and 22z that perform Fourier transform processing are used as the signal measurement device 20. In combination with such frequency analyzers that perform Fourier transform processing, or in place of the frequency analyzers that perform Fourier transform processing, time analyzers such as oscilloscopes that display time waveforms of magnetic field components in the respective axis directions may be used. Time analyzers may be used to measure the phases of magnetic field components in the respective axis directions.

In the above-described embodiment, magnetic field components are measured in three orthogonal axis directions. To measure magnetic field components in a plane, the structure may be configured to measure magnetic field components in two orthogonal axis directions. In this case, two magnetic sensors are used to detect magnetic field components in two axis directions, and interface circuits and frequency analyzers for the two magnetic sensors are used.

The magnetic field measurement device 1 according to the first embodiment may be installed in a vehicle. In this case, a control unit of the vehicle operates as the computer 24. The magnetic field measurement device 1 installed in the vehicle may be used to control magnetic field emission. The magnetic field detector 12 is disposed, for example, in the vicinity of the accelerator pedal, below a seat, or on the floor. Measurement values for each of the frequencies are output from the signal measurement device 20 to the control unit. The control unit determines a magnetic field emission intensity based on the measurement values output from the signal measurement device 20. When the magnetic field emission intensity exceeds a predetermined guideline value, the control unit controls electric circuits installed in the vehicle, such as an inverter and a DC/DC converter, to reduce magnetic field emission.

The magnetic field detector 12 may be used as a current sensor. For example, the magnetic field detector 12 is disposed close to a conductor included in an electric circuit or a conductor that connects between a plurality of electric circuits. The vehicle has installed therein a measuring instrument that measures a current flowing through a conductor based on magnetic field detection signals output from the magnetic field detector 12. The magnetic field detector 12 and the measuring instrument constitute a current measurement device for in-vehicle use.

The measuring instrument pre-stores measurement information including current measurement values and magnetic field detection signal magnitudes that are associated with each other. The measuring instrument may obtain a total sum by adding up the squares of the respective magnetic field detection signals of the x-axis direction magnetic field component, the y-axis direction magnetic field component, and the z-axis direction magnetic field component, and may determine the magnitude of magnetic field detection signal based on the square root of the total sum. The measuring instrument refers to the measurement information to obtain a current measurement value corresponding to the magnitude of magnetic field detection signal.

The control unit of the vehicle may control one or more electric circuits based on the current that is measured by the measuring instrument. Using the magnetic field detector 12 as a current sensor enables detection of a current without contact with the conductor. This facilitates measurement, as even when the conductor is coated with insulating material, it is unnecessary to peel off the insulating material.

Figure 4:
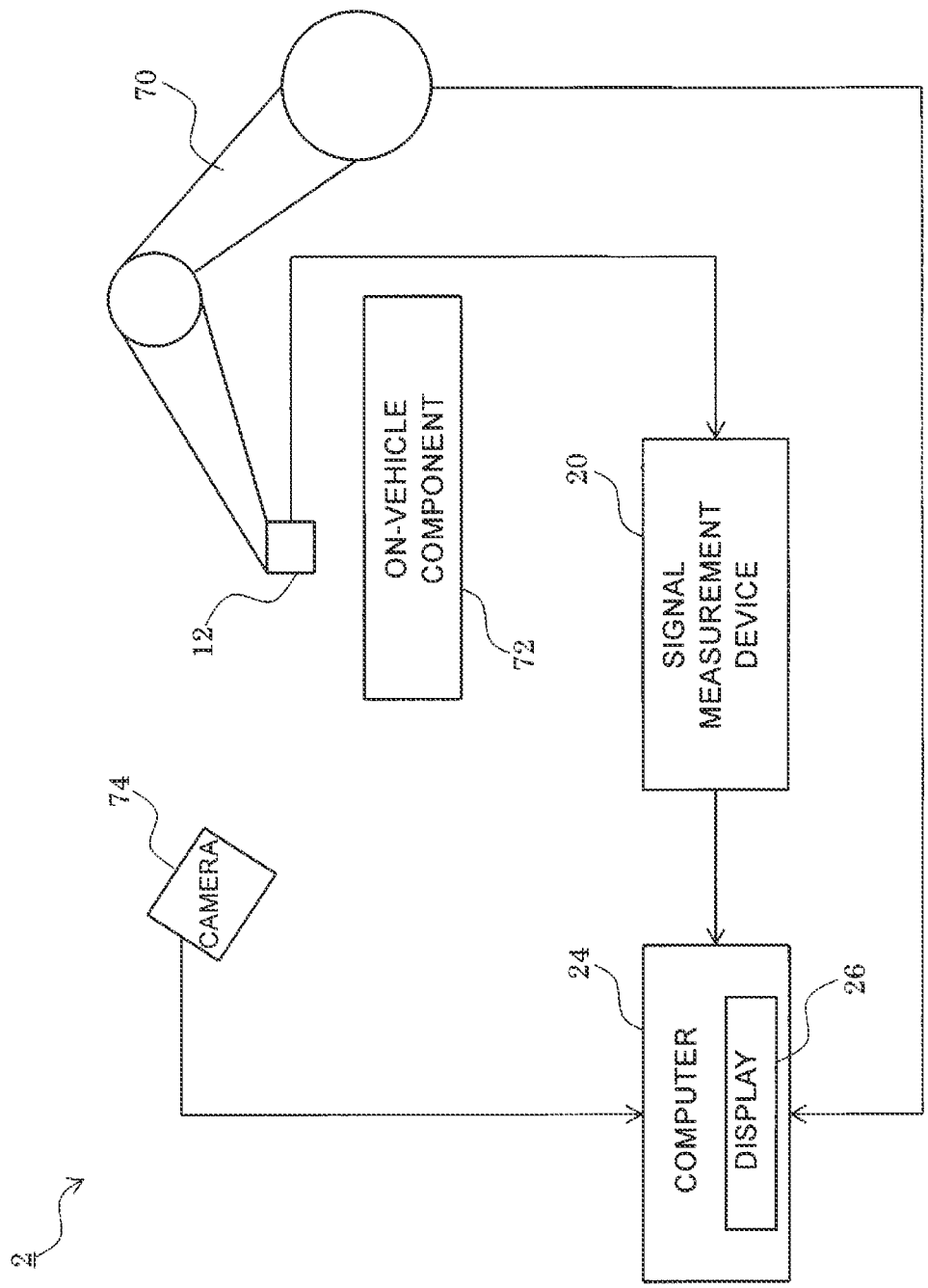
FIG. 4 illustrates a structure of a vehicle magnetic field measurement system according to a second embodiment.

FIG. 4 illustrates a structure of a vehicle magnetic field measurement system 2 according to a second embodiment. This system measures spatial distribution of magnetic field emission of an on-vehicle component 72 by measuring magnetic fields while scanning the vicinity of the on-vehicle component 72 using the magnetic field detector 12. The on-vehicle component 72 may be in a state in which it is installed in a vehicle or may be in a state in which it is removed from the vehicle. In either state, power from a power source is supplied to the on-vehicle component 72, and magnetic fields similar to those emitted during when the vehicle is traveling are emitted from the on-vehicle component 72.

The vehicle magnetic field measurement system 2 includes the magnetic field detector 12, a scanning device 70, the signal measurement device 20, the computer 24, and a camera 74. For example, a robot arm is used as the scanning device 70. Under control of the computer 24, the scanning device 70 scans the vicinity of the on-vehicle component 72 using the magnetic field detector 12 and outputs position information on the magnetic field detector 12 to the computer 24. The magnetic field detector 12 outputs, at positions in the vicinity of the on-vehicle component 72, respective magnetic field detection signals for the x-axis direction, the y-axis direction, and the z-axis direction to the signal measurement device 20. The signal measurement device 20 determines, based on the magnetic field detection signals, respective measurement values of the x-axis direction magnetic field component, the y-axis direction magnetic field component, and the z-axis direction magnetic field component at one or more measurement target frequencies, and outputs the determined measurement values to the computer 24. The camera 74 captures an image of the on-vehicle component 72 and outputs image data to the computer 24.

The computer 24 determines, based on the position information output from the scanning device 70 and the measurement values output from the signal measurement device 20, magnetic field emission intensities for the respective positions in the vicinity of the on-vehicle component 72 (hereinafter referred to as magnetic field emission distribution). The computer 24 may store information representing the magnetic field emission distribution in its memory or an external memory. The computer 24 may generate magnetic field emission image data based on the magnetic field emission distribution and the image data, and may display, on the display 26, an image based on the magnetic field emission image data. The magnetic field emission image data represents the magnetic field emission intensities by, for example, colors or numerical values at positions on an image representing the on-vehicle component 72.

In the vehicle magnetic field measurement system 2, a magnetic impedance element is used in the magnetic field detector 12. To obtain measurement values having the same level in response to magnetic fields having the same frequency, the magnetic impedance element can be smaller in size than a sensor coil. Therefore, the magnetic field emission distribution can be determined at narrower position intervals than when a sensor coil is used.

The invention claimed is:

1. A vehicle magnetic field measurement device comprising:
a plurality of magnetic sensors, each configured to detect magnetic fields in a different one of an x-axis direction, a y-axis direction, and a z-axis direction, each of the plurality of magnetic sensors comprising:
a magnetic impedance element having an impedance that varies in accordance with an ambient magnetic field; and an output circuit configured to output a magnetic field detection value that varies in accordance with the impedance of the magnetic impedance element, frequency analyzers, each for a different direction, configured to perform processing on magnetic field detection signals that are output from the corresponding magnetic sensors to determine measurement values of the magnetic field in the x-axis direction, the y-axis direction, or the z-axis direction for frequencies in a predetermined frequency band; and a computer configured to determine a measurement value of the magnetic field in the x-axis direction, the y-axis direction, or the z-axis direction for which a frequency deviation is compensated, wherein the computer pre-stores calibration information, wherein the vehicle field measurement device is configured to measure magnetic field emission from an on-vehicle component.

2. The vehicle magnetic field measurement device according to claim 1, comprising:

an oscillator configured to supply a common drive signal to the magnetic impedance element of each of the plurality of magnetic sensors, wherein each of the plurality of magnetic sensors outputs, in response to the drive signal, a magnetic field detection signal from the output circuit.

3. The vehicle magnetic field measurement device according to claim 1, comprising:

an interface circuit configured to match an input impedance of the frequency analyzer and an output impedance of the output circuit to each other.

4. The vehicle magnetic field measurement device according to claim 1, wherein the plurality of magnetic sensors comprise three magnetic sensors, and wherein the three magnetic sensors are configured to detect magnetic field components in three orthogonal axis directions.

5. A vehicle magnetic field measurement system comprising:

the vehicle magnetic field measurement device according to claim 1; and a scanning device configured to scan the plurality of magnetic sensors in a vicinity of the on-vehicle component; and wherein the computer is further configured to determine a magnetic field emission intensity based on the measurement values of the magnetic fields of different directions obtained from the plurality of magnetic sensors.

* * * * *